United States Patent
Giebeler et al.

(10) Patent No.: US 9,960,344 B2
(45) Date of Patent: May 1, 2018

(54) METHOD FOR PRODUCING A THIN FILM MADE OF LEAD ZIRCONATE TITANATE

(75) Inventors: Carsten Giebeler, Edinburgh (GB); Neil Conway, Fife (GB)

(73) Assignee: Pyreos LTD, Edinburgh (GB)

( * ) Notice: Subject to any disclaimer, the term of this patent is extended or adjusted under 35 U.S.C. 154(b) by 1295 days.

(21) Appl. No.: 13/985,646

(22) PCT Filed: Feb. 13, 2012

(86) PCT No.: PCT/EP2012/052419
§ 371 (c)(1),
(2), (4) Date: Oct. 28, 2013

(87) PCT Pub. No.: WO2012/110458
PCT Pub. Date: Aug. 23, 2012

(65) Prior Publication Data
US 2014/0049136 A1    Feb. 20, 2014

(30) Foreign Application Priority Data
Feb. 15, 2011 (DE) .................. 10 2011 000 752

(51) Int. Cl.
C23C 14/34        (2006.01)
H01L 41/187      (2006.01)
(Continued)

(52) U.S. Cl.
CPC ...... H01L 41/1876 (2013.01); C23C 14/0036 (2013.01); C23C 14/088 (2013.01);
(Continued)

(58) Field of Classification Search
CPC .................... C23C 14/088; C23C 14/0036
See application file for complete search history.

(56) References Cited

U.S. PATENT DOCUMENTS

| 5,196,101 A | * | 3/1993 | Thakoor | C23C 14/0036 204/192.15 |
| 5,397,446 A | * | 3/1995 | Ishihara | C23C 14/0036 204/192.15 |

(Continued)

FOREIGN PATENT DOCUMENTS

WO        0017921 A1    3/2000

OTHER PUBLICATIONS

International Search Report in counterpart International Application No. PCT/EP2012/052419, dated Apr. 18, 2012.
(Continued)

*Primary Examiner* — Jason Berman
(74) *Attorney, Agent, or Firm* — Edell, Shapiro & Finnan, LLC

(57) ABSTRACT

The invention relates to a method for producing the thin film made of lead zirconate titanate in a 111-oriented perovskite structure, comprising the following steps: providing a substrate having a substrate temperature above 450° C. and a lead target, a zirconium target, and a titanium target; applying the thin film by sputtering lead, zirconium, and titanium from the respective targets onto the substrate, wherein the total deposition rate of lead, zirconium, and titanium is greater than 10 nm/min, the deposition rate of zirconium is selected in such a way that the atomic concentration of zirconium with respect to the atomic concentration of zirconium together with titanium in the thin film is between 0.2 and 0.3, and the deposition rate of lead is selected to be sufficiently low, depending on the substrate temperature and the total deposition rate of lead, zirconium, and titanium, for an X-ray diffractometer graph of the 111-oriented lead zirconate titanate to have a significant peak value (19) in a diffraction angle range from 33 to 35.5°; and completing the thin film.

9 Claims, 2 Drawing Sheets

(51) Int. Cl.
*C23C 14/00* (2006.01)
*C23C 14/08* (2006.01)
*H01L 21/02* (2006.01)
*H01L 37/02* (2006.01)
*H01L 41/316* (2013.01)

(52) U.S. Cl.
CPC .... *C23C 14/3464* (2013.01); *H01L 21/02197* (2013.01); *H01L 21/02266* (2013.01); *H01L 37/025* (2013.01); *H01L 41/316* (2013.01)

(56) References Cited

U.S. PATENT DOCUMENTS 5,672,252 A * 9/1997 Hayashi .............. C23C 14/0078
204/192.12
6,440,210 B1 8/2002 Bruchhaus et al.

OTHER PUBLICATIONS

Bruchhaus, R. et al., "Optimized PZT thin films for pyroelectric IR detector arrays", Journal of Electroceramics, vol. 3, No. 2, Jun. 1, 1999, p. 151-162.

Giebeler, C. et al., "High performance PZT based pyro-detectors with D* of 2x10E9cmHzE/W for presence, gas and spectroscopy applications", Proceedings OPTO 2009 & IRS2 2009, IRS2 1—Infrared Sensors, May 2009, p. 185-189.

Bogomolov, A. et al., "Photovoltaic and pyroelectric effects in self-polarized ferroelectric PZT(25/75) films", Bulletin of the Russian Academy of Sciences: Physics, vol. 74, No. 9, Sep. 2010, p. 1307-1310.

Suchaneck, G. et al., "Multi-target reactive sputtering: A promising technology for large area . . . ", Journal of the European Ceramic Society, vol. 27, No. 13-15, Jan. 2007, p. 3789-3792.

Fujisawa, A. et al., "Effect of Zr/Ti ratio on crystal structure of thin lead zirconate-titanate films prepared by reactive sputtering", Japanese Journal of Applied Physics, vol. 32, part 1, No. 9B, Sep. 1993, p. 4048-4051.

Office Action in corresponding European Application No. 12705252.0, dated Jul. 8, 2015, along with a partial English translation.

Schreiter, A. et al., "Sputtering of self-polarized PZT films for IR-detector arrays", Applications of Ferroelectrics, Proceedings of the Eleventh IEEE International Symposium, Aug. 1998, p. 181-185.

Office Action in corresponding German Application No. 102011000752.0, dated Aug. 24, 2011, along with a partial English translation.

Ortner, K. et al., "Influence of bias voltage on the structure of lead zirconate . . . ", Plasma Processes and Polymers, vol. 4, 2007, p. 134-138.

Vidyarthi, V. et al., "Plasma emission controlled multi-target reactive sputtering for in-situ crystallized Pb(Zr,Ti)O3 thin films on 6" Si-wafers", LN: Thin solvently film, vol. 515, 2007, p. 3547-3553.

Yamakawa, K et al., "Preparation of lead zirconate titanate thin films by reactive magnetron co-sputtering", LN: Materials Letters, vol. 28, 1996, p. 317-322.

* cited by examiner

ERSATZBLATT (REGEL 26)

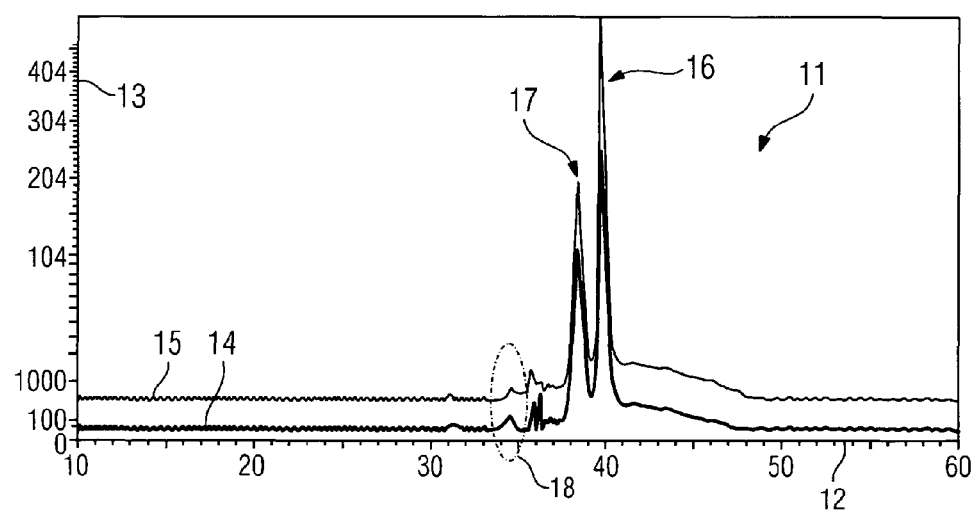

METHOD FOR PRODUCING A THIN FILM MADE OF LEAD ZIRCONATE TITANATE

The invention relates to a method for producing a thin film made of lead zirconate titanate in a 111-oriented perovskite structure.

A thin film made of lead zirconate titanate is used in electronic components wherein the advantageous dielectric, pyroelectric and piezoelectric properties of the lead zirconate titanate are made use of. Electronic components of this type are, for example, capacitors, pyrodetectors, piezoactuators or semiconductor memory stores.

In order to manufacture the component, by conventional means, a first electrode layer is deposited on a substrate and then thereon, the thin film made of a lead zirconate titanate, and thereon a second electrode layer is deposited. The thin film made of lead zirconate titanate is manufactured with a thin film method which, as known, is a sputter method, a CVD method or a sol-gel method. In the sputter method, a gas mixture of argon and oxygen is ionized to a plasma in a vacuum by means of a high voltage. Lead, zirconium and titanium are each provided in the form of a target, wherein the targets are connected in the circuit as the cathode and the substrate is connected as the anode. During sputtering, atoms are knocked out of the target and deposited on the substrate, forming a thin film. The substrate is conventionally a silicon wafer which, in subsequent processing steps, is manufactured in a membrane-like manner.

Platinum is suitable as the electrode material arranged beneath the thin film on the substrate because platinum can withstand the deposition conditions of the lead zirconate titanate at high substrate temperatures and in an oxygen-containing atmosphere during sputtering without suffering damage and no diffusion takes place into the thin film, which could lead to a disadvantageously changed composition and thus to a worsening of the properties of the thin film.

The configuration of the pyroelectric properties of the thin film depends on the composition of the thin film with lead, zirconium and titanium. For use of the thin film in an infrared sensor, the thin film is manufactured, in particular, at a thickness in the range of 0.2 µm to 3 µm using the sputtering method in a self-polarized manner. The sputtering method is to be carried out at an overall deposition rate of lead, zirconium and titanium in the range of 1 nm/min to 7 nm/min, wherein the thin film is configured with the 111-oriented perovskite structure and the thin film has a pyroelectric coefficient in the range of $2 \cdot 10^{-4}$ $C/m^2$ to $5 \cdot 10^{-4}$ $C/m^2$.

A disadvantage with said sputtering method is that the overall deposition rate of lead, zirconium and titanium in the range of 1 nm/min to 7 nm/min represents only a low production speed for the thin film so that, using this sputtering method, only a low throughput rate of thin films can be achieved, so that the economic viability of this sputtering method for producing the thin film is low.

It is an object of the invention to provide a method for producing a thin film made of lead zirconate titanate in a 111-oriented perovskite structure, wherein a high throughput rate of thin films can be achieved with the method although the thin film has a high pyroelectric coefficient.

This aim is achieved with the features of claims 1, 10 and 11. Advantageous embodiments of the invention are disclosed in the further claims.

The inventive method for producing the thin film made of lead zirconate titanate in a 111-oriented perovskite structure comprises the following steps: providing a substrate at a substrate temperature of over 450° C. and a lead target, a zirconium target and a titanium target; applying the thin film by sputtering lead, zirconium and titanium from the respective targets onto the substrate, wherein the overall deposition rate of lead, zirconium and titanium is greater than 10 nm/min, the deposition rate of zirconium is selected such that the atomic concentration of zirconium relative to the atomic concentration of zirconium together with titanium in the thin film lies in the range of 0.2 to 0.3, and the deposition rate of lead is selected to be sufficiently low, depending on the substrate temperature and the overall deposition rate of lead, zirconium and titanium that an X-ray diffractometer graph for the 111-oriented lead zirconium titanate has a significant peak value in the diffraction angle range from 33° to 35.5°; and completion of the thin film.

The sputtering of lead, zirconium and titanium from the respective targets onto the substrate is preferably carried out confocally and/or simultaneously. It is also preferred that the deposition rate of lead is selected such that the atomic concentration of lead relative to the atomic concentration of zirconium together with titanium in the thin film lies in the range of 1.1 to 1.3. Preferably, the overall deposition rate of lead, zirconium and titanium at a substrate temperature in the range of 500° C. to 550° C. is selected to lie in the range between 11 nm/min and 13 nm/min, wherein preferably, the deposition rate of lead is selected such that the atomic concentration of lead relative to the atomic concentration of zirconium together with titanium in the thin film lies in the range of 1.24 to 1.29 and preferably, the deposition rate of zirconium is selected such that the atomic concentration of zirconium relative to the atomic concentration of zirconium together with titanium in the thin film lies in the range of 0.25 to 0.29.

The significant peak value of an X-ray diffractometer graph for the thin film preferably lies in the diffraction angle range from 34° to 34.5°. Preferably also, the significant peak value in the X-ray diffractometer graph is caused by the thin film of crystals of a zirconium dioxide in the thin film. It is conceivable for the zirconium oxide to be zirconium dioxide or zirconium trioxide, etc.

The thin film is preferably applied such that the thin film is self-polarized. WO 00/17921 discloses a method for producing self-polarized ferroelectric layers, in particular made of lead zirconate titanate. The inventive method preferably also comprises the step: polarization of the thin film such that the pyroelectric coefficient of the thin film is greater than $10^{-4}$ $C/m^2$. The thin film preferably has a thickness in the range of 0.2 µm to 3 µm.

The thin film produced with the inventive method advantageously has a high pyroelectric coefficient which lies approximately in the range of $1.2 \cdot 10^{-4}$ to $5 \cdot 10^{-4}$ $C/m^2$, although the overall deposition rate is greater than 10 nm/min. This advantageously high pyroelectric coefficient is achieved for the thin film produced by the inventive method at the advantageously high overall deposition rate of more than 10 nm/min in that the deposition rate of zirconium is selected such that the atomic concentration of zirconium relative to the atomic concentration of zirconium together with titanium in the thin film lies in the range of 0.2 to 0.3, and the deposition rate of lead is selected to be sufficiently low, depending on the substrate temperature and the overall deposition rate of lead, zirconium and titanium, that an X-ray diffractometer graph for the 111-oriented lead zirconate titanate has a significant peak value in the diffraction angle range from 33° to 35.5°.

Preferably, the overall deposition rate of lead, zirconium and titanium lies in the range of 10 nm/min to 50 nm/min, wherein the thin film produced according to the invention preferably has the significant peak value in the X-ray diffractometer graph thereof in the diffraction angle range from 34° to 34.5°. Due to the appearance of the significant peak value in the X-ray diffractometer graph for the lead zirconium titanate produced according to the invention in the diffraction angle range from 33° to 35.5°, and preferably 34° to 34.5°, a further phase is created in the thin film, caused by crystals of a zirconium oxide. The zirconium oxide can be zirconium dioxide or zirconium trioxide or the like.

If, however, a thin film is produced at a substrate temperature of 550° C., wherein the deposition rate of lead is selected such that an X-ray diffractometer graph for the lead zirconate titanate has no significant peak value in the diffraction angle range from 33° to 35.5°, then the high pyroelectric coefficient achievable according to the invention can only be achieved if the overall deposition rate of lead, zirconium and titanium is less than 10 nm/min.

Due to the fact that it is made possible with the inventive production method to select the overall deposition rate of lead, zirconium and titanium to be high, specifically higher than 10 nm/min, using the method according to the invention, the thin film can be produced rapidly and economically although the thin film still has a high pyroelectric coefficient, specifically in the range of $1.2 \cdot 10^{-4}$ C/m$^2$ to $5 \cdot 10^{-4}$ C/m$^2$.

It is therefore advantageous, with the overall deposition rate of lead, zirconium and titanium greater than 10 nm/min, to produce the thin film such that the X-ray diffractometer graph of the thin film has a significant peak value in the diffraction angle range from 33° to 35.5°, since as a consequence thereof the pyroelectric coefficient of the thin film is high.

In order that the lead zirconate titanate can be produced in the perovskite structure, the substrate temperature should be selected to be above 450° C. The atomic concentration of zirconium relative to the atomic concentration of zirconium together with titanium in the thin film is essentially independent of the level of the substrate temperature. However, since lead has a low evaporation temperature relative to the substrate temperature, the ratio of the deposition rate of lead relative to the deposition rate of zirconium together with titanium has to be adjusted, correspondingly, to the selected substrate temperature in order to compensate for the elevated evaporation of lead from the substrate at high substrate temperatures. Similarly, with substrate temperatures which are selected to be low, the deposition rate for lead has, accordingly, to be reduced since the evaporation of lead is reduced. If, however, at a reduced substrate temperature, the deposition rate of lead should be too high, then the atomic concentration of lead relative to the atomic concentration of zirconium together with titanium in the thin film is too high, with the result that the 111-orientation of the lead zirconate titanate would not be achievable.

In order to obtain the 111-orientation of the perovskite structure of the lead zirconate titanate, the deposited lead, zirconium and titanium is to be provided with an activation energy with a substrate temperature selected to be correspondingly high, such that the lead zirconate titanate is configured in the 111-oriented perovskite structure. It is preferable when sputtering lead, to apply zirconium and titanium to the substrate at the same time, so that lead, zirconium and titanium form into the lead zirconate titanate in a 111-oriented perovskite structure.

In principle, it is desirable to carry out the sputtering at the highest possible disposition rates of lead, zirconium and titanium so that the throughput rate during production of the thin film is high. However, with deposition rates of lead, zirconium and titanium that are set unsuitably high, there is no longer sufficient time for the lead, zirconium and titanium to become arranged in the 111-oriented perovskite structure, because too much material is deposited from the target onto the substrate per unit time. In order to compensate therefor, the substrate temperature could be further increased, wherein an increase in the substrate temperature would have to be associated with an increase in the activation energy, thus increasing the probability that lead, zirconium and titanium become arranged in the 111-oriented perovskite structure. However, in this context, due to the increased substrate temperature, the deposition rate of lead is to be increased.

The inventive electronic component has, as the substrate, a membrane and the thin film which is applied to the membrane, wherein the thin film is made of lead zirconium titanate in the 111-orientated perovskite structure with the inventive method. According to the invention, the component is used as a thermal imaging camera, a presence detector, a motion sensor, a gas detector, a gesture recognition detector, a spectroscope and/or a terahertz detector.

The substrate is preferably a silicon wafer onto which the membrane made of silicon dioxide and/or silicon nitride and/or silicon dioxide is applied. An electrode with an adhesive layer made, for example, of aluminum oxide ($Al_2O_3$) or titanium, followed by a platinum layer is removed from the membrane. The thin film is applied to the whole area of the platinum layer. In a subsequent step, both layers are structured such that a pixel or a plurality of pixels is formed in a partial area on the front side of the membrane. The material of the silicon wafer is applied to the side facing away from the thin film such that the membrane is uncovered and thermally insulated on the rear side at least in the region of the partial area.

The invention will now be described with reference to the accompanying schematic drawings, in which:

FIG. 3 is an X-ray diffractometer graph for lead zirconate titanate of a conventionally produced thin film.

Figure 1:
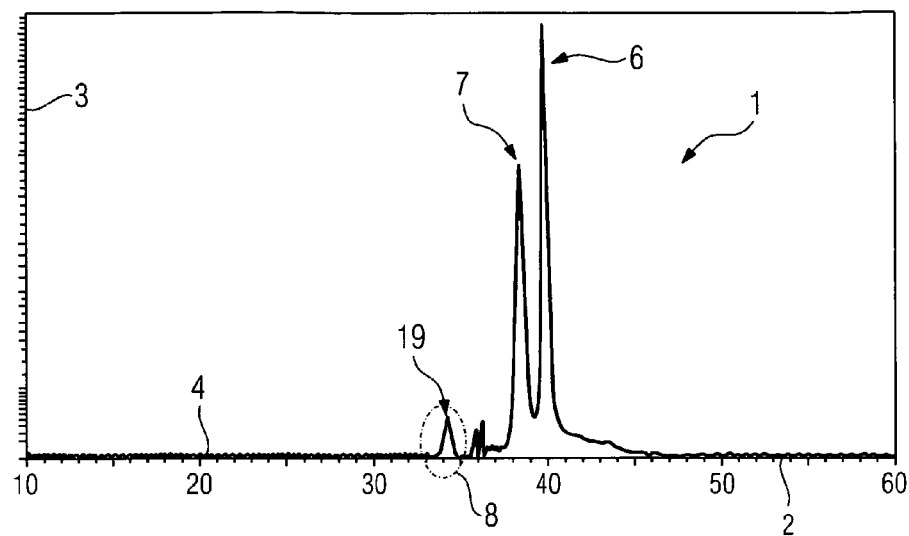
FIG. 1 is an X-ray diffractometer graph for the lead zirconate titanate of a thin film produced according to the invention.

FIG. 3 shows an X-ray diffractometer graph 11 of lead zirconate titanate which was produced according to a conventional sputtering method. The X-ray diffractometer graph 11 has an abscissa 12 along which the diffraction angle is indicated, and an ordinate 13 along which the amplitude is indicated. The thin film was applied to a substrate, the substrate being a silicon wafer.

A first curve 14 and a second curve 15 respectively show the spectrum for lead zirconate titanate in a thin film. The thin films were applied to the substrate using the conventional sputtering method wherein, for the first curve 14, the substrate temperature was 500° C. and for the second curve 15, the substrate temperature was 550° C. Both thin films were produced with an overall deposition rate of lead, zirconium and titanium of 5 nm/min, the pyroelectric coefficient being approximately $2 \cdot 10^{-4}$ C/m$^2$.

In both the curves 14 and 15, a significant peak value 16 is shown for platinum and a significant peak value 17 is shown for lead zirconate titanate in a 111-oriented perovskite structure. The slightly uneven course of the curves 14 and 15 is due to background noise. In the range of diffraction angles 18 from 33° to 35.5°, a significant peak value does not arise.

FIG. 1 shows an X-ray diffractometer graph 1 for lead zirconate titanate produced, according to a third curve 4, with the inventive method. For the inventive method, an overall deposition rate of lead, zirconium and titanium of 15 nm/min is used. The X-ray diffractometer graph 1 has an abscissa 2 along which the diffraction angle is indicated, and an ordinate 3 along which the amplitude is indicated. The thin film was applied to a substrate, the substrate being a silicon wafer.

The third curve 4 has a significant peak value 6 for platinum and a significant peak value 7 for lead zirconate titanate in a 111-oriented perovskite structure. When the thin film was produced, the substrate was heated to a temperature of 550° C. The thin film was applied onto the substrate by sputtering lead, zirconium and titanium using a lead target, a zirconium target and a titanium target, wherein the overall deposition rate of lead, zirconium and titanium was 15 nm/min.

For the thin film according to the third curve 4, the deposition rate of lead is selected such that the atomic concentration of lead relative to the atomic concentration of zirconium together with titanium in the thin film lies in the range of 1.24 to 1.26. The pyroelectric coefficient of the thin film according to the third curve 4 is $2 \cdot 10^{-4}$ C/m$^2$.

Figure 2:
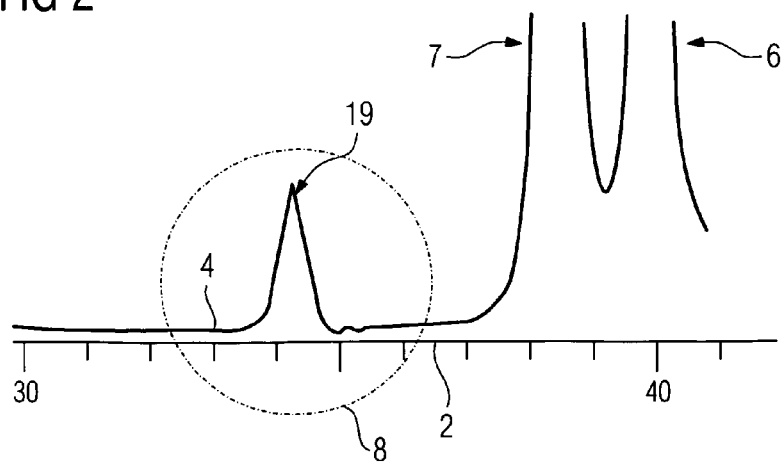
FIG. 2 is a portion of the X-ray diffractometer graph of FIG. 1.

The diffraction angle range 8 between 33° and 35.5° is shown in the detail illustration of FIG. 2. In the third curve 4, a significant peak value lies in the diffraction angle range from 34° to 34.5°. In contrast thereto, the curves 14 and 15 in FIG. 3 have no significant peak value in the diffraction angle range 8 between 33° and 35.5°. The significant peak 19 value in the diffraction angle range from 34° to 34.5° is to be found only in the third curve 4 and not in the first curve 14 and the second curve 15.

REFERENCE SIGNS

1 X-ray diffractometer graph (overall deposition rate at 15 nm/min)
2 Abscissa: diffraction angle
3 Ordinate: amplitude
4 Third curve
6 Significant peak value for lead
7 Significant peak value for lead zirconate titanate
8 Diffraction angle in the range form 33° to 35.5°
9 Significant peak value in the diffraction angle range from 34° to 34.5°.
11 X-ray diffractometer graph (overall deposition rate at 5 nm/min)
12 Abscissa: diffraction angle
13 Ordinate: amplitude
14 First curve (substrate temperature 450°)
15 Second curve (substrate temperature 550°)
16 Significant peak value for lead
17 Significant peak value for lead zirconate titanate
18 Diffraction angle range from 33° to 35.5°

The invention claimed is:

1. A method for producing a thin film made of lead zirconate titanate in a 111-oriented perovskite structure, comprising:
   providing a substrate at a temperature of over 450° C. and a lead target, a zirconium target and a titanium target;
   applying the thin film by sputtering of lead, zirconium and titanium from the respective targets onto the substrate, wherein
   an overall deposition rate of lead, zirconium and titanium is greater than 10 nm/min,
   the deposition rate of zirconium is selected such that the atomic concentration of zirconium relative to the atomic concentration of zirconium together with titanium in the thin film lies in the range of 0.2 to 0.3, and
   the deposition rate of lead is selected to be sufficiently low, depending on the substrate temperature and the overall deposition rate of lead, zirconium and titanium that an X-ray diffractometer graph for the 111-oriented lead zirconate titanate has a significant peak value in the diffraction angle range from 33° to 35.5°; and
   completing the thin film.

2. The method as claimed in claim 1, wherein the sputtering of lead, zirconium and titanium from the respective targets onto the substrate is carried out confocally and/or simultaneously.

3. The method as claimed in claim 1, wherein the deposition rate of lead is selected such that the atomic concentration of lead relative to the atomic concentration of zirconium together with titanium in the thin film lies in the range of 1.1 to 1.3.

4. The method as claimed in claim 1, wherein the overall deposition rate of lead, zirconium and titanium at a substrate temperature in the range of 500° C. to 550° C. is selected to lie in the range between 11 nm/min and 13 nm/min, the deposition rate of lead is selected such that the atomic concentration of lead relative to the atomic concentration of zirconium together with titanium in the thin film lies in the range of 1.24 to 1.29 and the deposition rate of zirconium is selected such that the atomic concentration of zirconium relative to the atomic concentration of zirconium together with titanium in the thin film lies in the range of 0.25 to 0.29.

5. The method as claimed in claim 1, wherein the significant peak value of an X-ray diffractometer graph for the thin film lies in the diffraction angle range from 34° to 34.5°.

6. The method as claimed in claim 1, wherein the significant peak value in the X-ray diffractometer graph of the thin film is caused by crystals of a zirconium dioxide in the thin film.

7. The method as claimed in claim 1, wherein the thin film is applied such that the thin film is self-polarized.

8. The method as claimed in claim 1, further comprising:
   polarizing the thin film such that the pyroelectric coefficient of the thin film is greater than $10^{-4}$ C/m$^2$.

9. The method as claimed in claim 1, wherein the thin film has a thickness in the range of 0.2 μm to 3 μm.

* * * * *